(12) United States Patent
Ohmi et al.

(10) Patent No.: US 8,643,106 B2
(45) Date of Patent: Feb. 4, 2014

(54) SEMICONDUCTOR DEVICE

(75) Inventors: Tadahiro Ohmi, Miyagi (JP); Akinobu Teramoto, Miyagi (JP); Cheng Weitao, Miyagi (JP)

(73) Assignees: National University Corporation Tohoku University, Miyagi (JP); Foundation for Advancement of International Science, Ibaraki (JP)

( * ) Notice: Subject to any disclaimer, the term of this patent is extended or adjusted under 35 U.S.C. 154(b) by 487 days.

(21) Appl. No.: 12/308,846

(22) PCT Filed: Jun. 21, 2007

(86) PCT No.: PCT/JP2007/062541
§ 371 (c)(1),
(2), (4) Date: Dec. 24, 2008

(87) PCT Pub. No.: WO2008/001680
PCT Pub. Date: Jan. 3, 2008

(65) Prior Publication Data
US 2009/0250755 A1    Oct. 8, 2009

(30) Foreign Application Priority Data
Jun. 27, 2006 (JP) ................. 2006-176945

(51) Int. Cl.
*H01L 27/12* (2006.01)
(52) U.S. Cl.
USPC .... 257/347; 257/402; 257/407; 257/E27.112; 257/E29.137
(58) Field of Classification Search
None
See application file for complete search history.

(56) References Cited

U.S. PATENT DOCUMENTS

| | | |
|---|---|---|
| 5,111,260 A | 5/1992 | Malhi et al. |
| 5,926,703 A | 7/1999 | Yamaguchi et al. |
| 6,043,536 A * | 3/2000 | Numata et al. ................. 257/347 |
| 6,063,686 A | 5/2000 | Masuda et al. |
| 6,259,136 B1 * | 7/2001 | Kawaguchi et al. .......... 257/336 |
| 6,306,709 B1 | 10/2001 | Miyagi et al. |
| 6,498,376 B1 | 12/2002 | Miyagi et al. |
| 6,989,569 B1 | 1/2006 | Hiramoto et al. |
| 7,115,950 B2 | 10/2006 | Tokushige |
| 7,259,428 B2 | 8/2007 | Inaba |
| 2001/0044174 A1 | 11/2001 | Hamatake |
| 2003/0209761 A1 | 11/2003 | Yagishita et al. |
| 2004/0079997 A1 * | 4/2004 | Miura ........................... 257/347 |

FOREIGN PATENT DOCUMENTS

| | | |
|---|---|---|
| EP | 1 906 440 A1 | 4/2008 |
| JP | 63-198374 | 8/1988 |
| JP | 05-235350 | 9/1993 |
| JP | 08-222705 | 8/1996 |

(Continued)

OTHER PUBLICATIONS

Chinese Patent Office first office action on application No. 200780031903.4 dated Apr. 29, 2010; 6 pages.

(Continued)

*Primary Examiner* — Benjamin Sandvik
*Assistant Examiner* — Leslie Pilar Cruz
(74) *Attorney, Agent, or Firm* — Foley & Lardner LLP

(57) ABSTRACT

A transistor capable of adjusting a threshold value is obtained by adjusting an impurity concentration of a silicon substrate supporting an SOI layer and by controlling a thickness of a buried insulating layer formed on a surface of the silicon substrate in contact with the SOI layer.

10 Claims, 7 Drawing Sheets

(56) References Cited

FOREIGN PATENT DOCUMENTS

| JP | 8-274330 | | 10/1996 |
|---|---|---|---|
| JP | 11-330482 | A | 11/1999 |
| JP | 2004-146550 | A | 5/2004 |
| JP | 2006-049628 | A | 2/2006 |
| JP | 2007-027677 | A | 2/2007 |
| JP | 2007-149853 | A | 6/2007 |
| KR | 2001-0029972 | A | 4/2001 |
| KR | 2001-0039879 | A | 5/2001 |

OTHER PUBLICATIONS

Chinese Patent Office third office action on application No. 200780031903.4 dated Feb. 11, 2011; 3 pages.

Rauly, E., et al.; Investigation of Deep Submicron Single and Double Gate SOI MOSFETs in Accumulation Mode for Enhanced Performance; Electrochemical and Solid-State Letters, 4(3); 2001; pp. G28-G30.

Tack, M., et al.; An Analytical Model for the MISIS Structure in SOI MOS Devices; Solid-State Electronics vol. 33, No. 3; 1990; pp. 357-364.

Omura, Y., et al.; Quantum mechanical effect in temperature dependence of threshold voltage of extremely thin SOI MOSFETs; Solid-State Electronics 48; 2004; pp. 1661-1666.

European Patent Office extended search report on application No. 07767367.1 dated Apr. 18, 2011; 10 pages.

Korean Office Action dated Jun. 17, 2013 with partial English translation; 6 pages.

\* cited by examiner

SEMICONDUCTOR DEVICE

This application is the National Phase of PCT/JP2007/062541, filed Jun. 21, 2007, which claims priority to Japanese Application No. 2006-176945, filed Jun. 27, 2006, the disclosures of which are hereby incorporated by reference in their entirety.

TECHNICAL FIELD

This invention relates to a semiconductor device, such as an IC and an LSI, and, in particular, to an accumulation-mode MOS transistor.

BACKGROUND ART

As an example of semiconductor devices to which this invention relates, there is a semiconductor device described in Japanese Patent Application No. 2005-349857 (Patent Document 1) proposed by the present inventors. Patent Document 1 proposes the semiconductor device provided with a circuit having at least one pair of transistors of different conductivity types in which at least one of the transistors includes at least a semiconductor layer formed on an SOI base substrate, a gate insulating layer covering at least a part of a surface thereof, and a gate electrode formed on the gate insulating film, and is formed as a normally-off accumulation mode transistor. A material of the gate electrode and an impurity concentration of the semiconductor layer are selected in such a manner that a thickness of a depletion layer formed in the semiconductor layer by a difference in work function (work function difference) between the gate electrode and the semiconductor layer is greater than a film thickness of the semiconductor layer.

Further, Patent Document 1 discloses that, for the purpose of equalizing current driving capabilities of a p-channel transistor and an n-channel transistor constituting CMOS transistors, the current driving capability of the p-channel transistor can be enhanced by using a (110) plane of silicon. According to this structure, switching speeds of the n-channel transistor and the p-channel transistor can substantially be equalized and areas occupied by electrodes formed on channel regions can substantially be equalized.

Patent Document 1: Japanese Patent Application No. 2005-349857

DISCLOSURE OF THE INVENTION

Problem to be Solved by the Invention

Patent Document 1 discloses that the accumulation-mode MOS transistor can be normally off by a work function difference between the gate electrode and the SOI layer. For example, when the gate electrode is formed with polycrystalline silicon containing boron of not less than $10^{20}$ cm$^{-3}$ and the SOI layer is formed by an n-type silicon layer having an impurity concentration of $10^{17}$ cm$^{-3}$, a work function difference of approximately 0.9 eV is produced, because P+polycrystalline silicon having the mentioned impurity concentration has a work function of approximately 5.15 eV and the n-type silicon having the mentioned impurity concentration has a work function of approximately 4.25 eV. At this time, the depletion layer has a thickness of about 90 nm. Therefore, if the SOI layer has a thickness of 45 nm, the SOI layer is fully depleted and a normally-off transistor can be obtained.

However, with this structure, there is a problem that the material of the gate electrode is limited. For example, even if Ta is intended to be used for the gate electrode, the use is difficult. This is because its work function is 4.6 eV and has only a very slight difference from that of the SOI layer. Further, in the accumulation-mode MOS transistor, it is required to make the impurity concentration of the SOI layer high in order to increase the current driving capability of the transistor, because a bulk current flows through the entire SOI layer in addition to an electric current of an accumulation layer when the transistor is turned on. As the impurity concentration of the SOI layer is higher, the bulk current of the entire SOI layer becomes higher and a 1/f noise decreases. Thus, in the accumulation-mode MOS transistor, the SOI layer desirably has a high impurity concentration. However, if the impurity concentration of the SOI layer is one digit greater, the thickness of the depletion layer is reduced to ¼ to ⅐. Therefore, it is required to reduce the film thickness of the SOI layer. However, in that case, the bulk current of the entire SOI layer is reduced. Consequently, the material of the gate electrode must have a greater difference in work function from the SOI layer. As a result, a threshold voltage of the transistor is made high and driving the transistor at a low power supply voltage becomes difficult.

It is an object of the present invention to provide a semiconductor device in which a threshold voltage can be made low and which can be reduced in size.

It is a specific object of the present invention to provide an accumulation-mode semiconductor device which can be normally off even by the use of a gate electrode which does not have a large difference in work function from an SOI layer.

It is another object of the present invention to provide an accumulation-mode semiconductor device which can be normally off without increasing a threshold voltage even if an impurity concentration of an SOI layer is made high.

It is a another object of the present invention to provide a new technique capable of controlling a thickness of a depletion layer in an SOI layer except by using a work function difference between a gate electrode and the SOI layer.

It is another object of the present invention to provide a method of manufacturing a semiconductor device in which a threshold voltage can be made low.

Means to Solve the Problem

According to a first aspect of the present invention, there is provided a semiconductor device formed by using a base substrate having at least a first semiconductor region, a buried insulating layer formed thereon, and a second semiconductor region formed on the buried insulating layer, at least a part of the second semiconductor region serving as a channel region, a gate insulating film formed on the channel region, and a gate electrode formed thereon, wherein a thickness of a depletion layer in the channel region is controlled by a thickness of the buried insulating layer and an impurity concentration of the second semiconductor region.

According to a second aspect of the present invention, there is provided the semiconductor device, wherein a threshold value depends on the thickness of the buried insulating layer and the impurity concentration of the first semiconductor region.

According to a third aspect of the present invention, there is provided the semiconductor device, wherein the semiconductor device has a source region and a drain region electrically connected to the channel region, the gate electrode being constructed by at least partially using a material having a work function different from that of the channel region, the thickness of the depletion layer in the channel region being determined by adjusting a work function difference between the gate electrode and the channel region, the impurity concentration of the first semiconductor region, and the thickness of the buried insulating layer. Herein, the impurity concentration of the second semiconductor region is preferably $10^{17}$ cm$^{-3}$, more preferably $2\times10^{17}$ cm$^{-3}$.

According to a fourth aspect of the present invention, there is provided the semiconductor device, wherein the threshold value is smaller than that determined by the work function difference between the gate electrode and the channel region.

According to a fifth aspect of the present invention, there is provided the semiconductor device, wherein the first semiconductor region and the second semiconductor region are made of silicons having opposite conductivity types to each other.

According to a sixth aspect of the present invention, there is provided the semiconductor device, wherein the semiconductor device is of an accumulation mode with the channel region, the source region, and the drain region having the same conductivity type.

According to a seventh aspect of the present invention, there is provided the semiconductor device, wherein the semiconductor device is of a normally-off type.

According to an eighth aspect of the present invention, there is provided the semiconductor device, wherein the buried insulating layer has a thickness which is not greater than 20 nm and which preferably satisfies the following formula.

$$0.56 T_{SOI} < T_{BOX} < 0.85 T_{SOI}$$

Herein, $T_{BOX}$ and $T_{SOI}$ denote EOT (Effective Oxide Thickness, namely, equivalent $SiO_2$ thickness) of the buried insulating layer and a thickness of the second semiconductor region, respectively.

According to a ninth aspect of the present invention, three is provided a method of manufacturing a semiconductor device formed on a base substrate having a buried insulating layer and having a gate electrode and a threshold value, wherein the threshold value is controlled by adjusting an impurity concentration of the base substrate.

According to a tenth aspect of the present invention, there is provided the method of manufacturing a semiconductor device, wherein the impurity concentration of the base substrate is adjusted by ion implantation According to another aspect of the present invention, there is provided a semiconductor device comprising a semiconductor layer having two principal faces, a gate electrode formed on one face of the semiconductor layer with a gate insulating film inserted therebetween, and a conductive layer formed on the other face of the semiconductor layer with a buried insulating layer inserted therebetween, wherein at least a part of the semiconductor layer is used as a channel region and the buried insulating layer has a thickness not greater than 20 nm, a thickness of a depletion layer in the channel region being made greater than that of the semiconductor layer by a thickness of the buried insulating layer, a work function difference between a material of the gate electrode and the semiconductor layer, and a work function difference between the conductive layer and the semiconductor layer.

Effect of the Invention

According to the present invention, a new semiconductor device is obtained in which a thickness of a depletion layer in a channel region is reduced by reducing a film thickness of a buried insulating layer and controlled by an impurity concentration of a semiconductor region on a base substrate side. Especially, in an accumulation-mode MOSFET, normally-off can be achieved without increasing a threshold value by adjusting an impurity concentration of a base substrate either without performing control by a work function difference between a gate electrode and a channel region or in combination with such control. The present invention is advantageous in that a semiconductor device having a low threshold voltage and reduced in size can be obtained. That is, in the present invention, a semiconductor device operable at a high speed and a low power supply voltage can be constructed.

BEST MODE FOR EMBODYING THE INVENTION

Figure 1A:
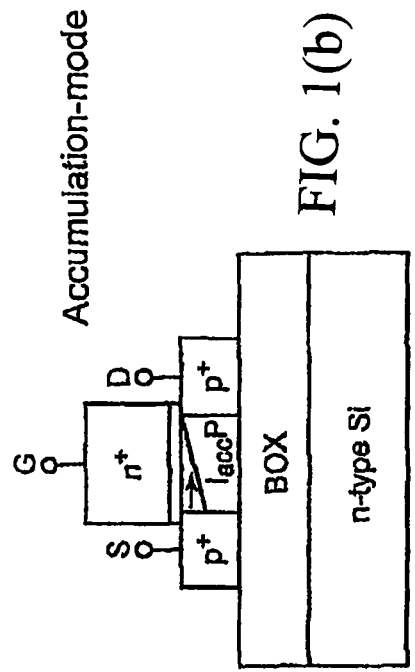
FIGS. 1(a), 1(b), 1(c), and 1(d) are sectional views showing schematic structures of NMOS and PMOS transistors, respectively, to which the present invention is applicable.
Figure 1B:
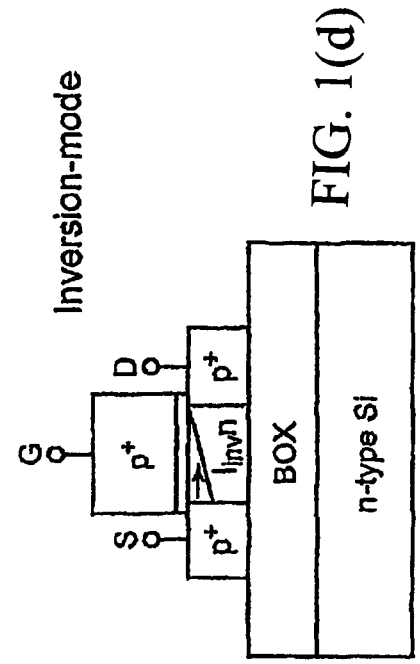
Figure 1C:
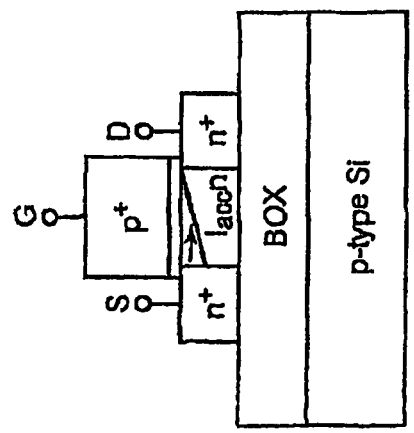
Figure 1D:
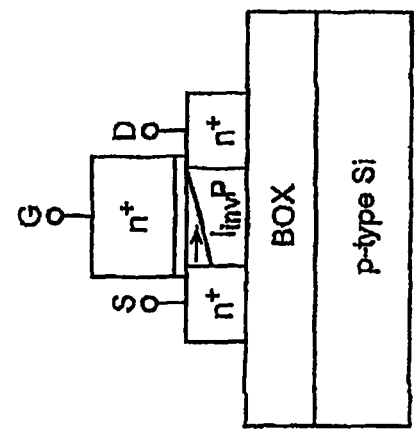
Figure 2A:
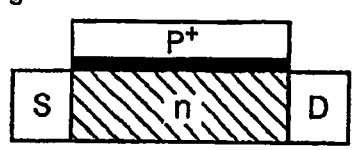
FIGS. 2(a), 2(b), 2(c), and 2(d) are views for describing an operating principle of the NMOS transistor according to the present invention.
Figure 2A:
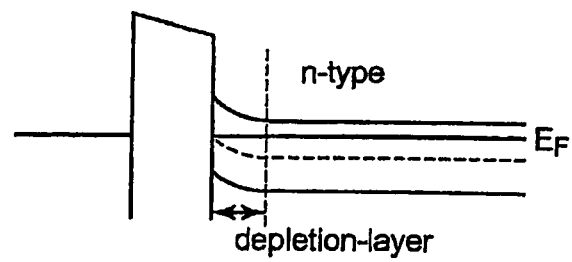
Figure 2B:
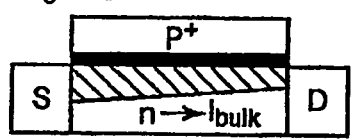
Figure 2B:
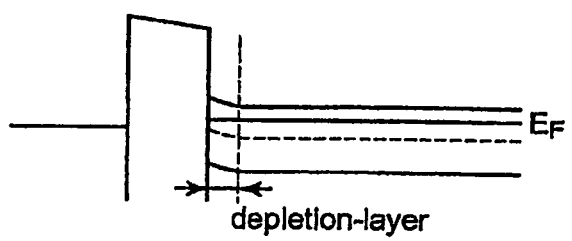
Figure 2C:
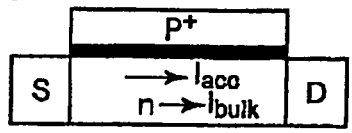
Figure 2C:
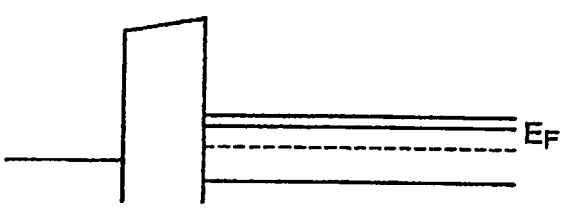
Figure 2D:
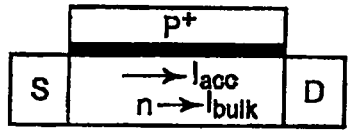
Figure 2D:
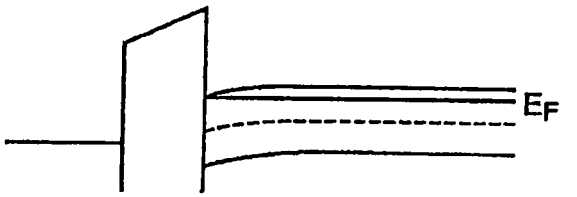

Hereinbelow, a semiconductor device of the present invention will be described with reference to the drawing.

Referring to FIG. 1, an accumulation-mode MOS transistor and an inversion-mode MOS transistor are shown, to which the present invention is applicable. Herein, FIGS. 1 (a) and (b) show n-channel and p-channel accumulation-mode MOS transistors (an NMOS transistor and a PMOS transistor), respectively, and FIGS. 1 (c) and (d) show n-channel and p-channel inversion-mode MOS transistors, respectively.

In a case of the NMOS transistor shown in FIG. 1 (a), a buried insulating layer (BOX) is formed on a surface region of a p-type silicon base substrate. On the buried insulating layer (BOX), an n-type SOI (Silicon On Insulator) layer is formed. Further, the n-type SOI layer forms source, drain, and channel regions. Among them, each of the source and the drain regions has an impurity concentration higher than that of the channel region. Further, the source and the drain regions are connected to a source electrode S and a drain electrode D, respectively. Herein, on the channel region, a gate insulating film is formed. On the gate insulating film, a gate electrode of p-type polycrystalline silicon is formed.

On the other hand, in a case of the PMOS transistor shown in FIG. 1 (b), a buried insulating layer (BOX) is formed on an n-type silicon base substrate. On the buried insulating layer (BOX), a p-type SOI layer constituting source, drain, and channel regions is formed. Each of the source and the drain regions has an impurity concentration higher than that of the channel region. Further, on the channel region, a gate electrode of n-type polycrystalline silicon is formed with a gate insulating film intermediate therebetween. FIGS. 1 (*c*) and (*d*) show similar structures as illustrated in the figure.

In each of the NMOS transistor and the PMOS transistor in FIGS. 1 (*a*) and (*b*), when a gate voltage Vg is zero, a depletion layer spreads throughout the SOI layer. When the gate voltage Vg is applied, the depletion layer retreats to an upper surface of the channel region. Further, when the gate voltage Vg becomes higher, each transistor performs an operation such that an accumulation current flows in addition to a bulk current. Each of the NMOS transistor and the PMOS transistor in FIGS. 1 (*c*) and (*d*) is off when the gate voltage Vg is zero. When the gate voltage Vg is applied, an inversion layer is formed on an upper surface of a channel region and an electric current flows between source and drain regions.

FIG. 2 (*a*) through (*d*) show an operating principle of the accumulation-mode NMOS transistor mentioned above. First, as shown in FIG. 2 (*a*), when the gate voltage Vg is zero, the depletion layer spreads throughout the SOI layer. As shown in FIG. 2 (*b*), when the gate voltage Vg is applied, the depletion layer retreats to the upper surface of the channel region and a bulk current Ibulk starts to flow. Further, when the gate voltage Vg increases, an accumulation current Iacc also starts to flow, as shown in FIGS. 2 (*c*) and (*d*).

Figure 3A:
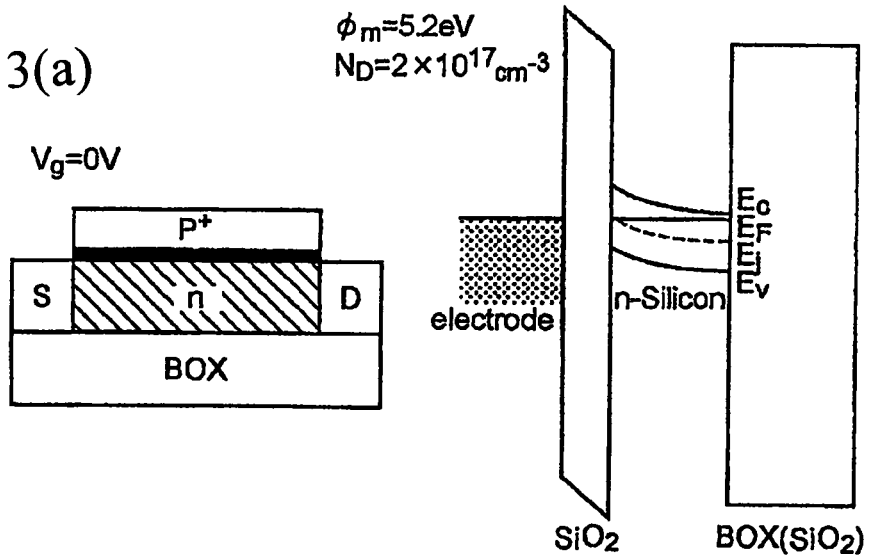
FIGS. 3(a) and 3(b) are views for describing a band structure in an accumulation-mode NMOS transistor, in association with its section.
Figure 3B:
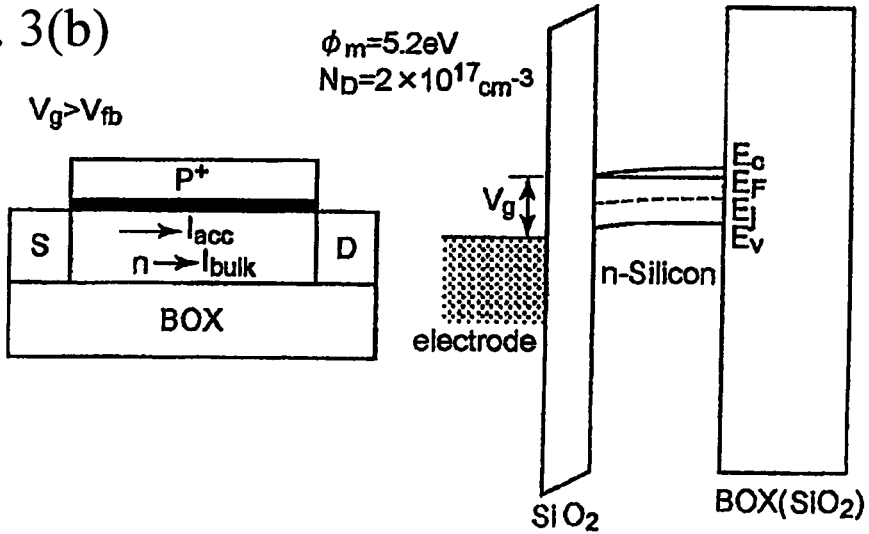

Taking the NMOS transistor as an example, the above-mentioned phenomenon will further be described by the use of FIGS. 3 (*a*) and (*b*). Let an SOI structure be used and the depletion layer generated by the work function difference between the gate electrode and the SOI layer have a thickness greater than that of the SOI layer. Then, a normally-off type MOS transistor having an accumulation structure as shown in FIG. 3 (*a*) can be achieved. Herein, in the NMOS transistor as shown in the figure, p+polysilicon (having a work function of 5.2 eV) is used for the gate electrode while, in the p-channel transistor, n+polysilicon (having a work function of 4.1 eV) is used for the gate electrode. Then, a difference in work function between the gate electrode and the SOI layer can be produced.

In order to make the depletion layer thicker than the SOI layer to achieve an off-state (namely, a normally-off state) when the gate voltage Vg is zero, it is required to significantly change a work function of the gate electrode as compared with that of the SOI layer. However, this technique causes the problem as mentioned before to occur. Particularly, this technique is disadvantageous in that, if an impurity concentration of the SOI layer is made high, a threshold voltage is made high. In other words, by a typical method of manufacturing an accumulation-mode NMOS transistor, only a transistor having a high threshold voltage can be manufactured. As a result, it is impossible not only to reduce the size of the transistor but also to achieve a low-voltage power supply of an integrated circuit. Further, as the gate electrode, use of Ta 4.6 eV having a small difference in work function is impossible.

The present inventors prepared an accumulation-mode NMOS transistor in which a silicon base substrate and an SOI layer are inverse in conductivity type from each other and a buried insulating layer (BOX) has a thickness of 100 nm, like the MOS transistors shown in FIGS. 1 (*a*) and (*b*) (especially, the NMOS transistor), and conducted an experiment. The NMOS transistor used in the experiment has a structure same as that described in Patent Document 1. In the experiment, use was made of an NMOS transistor having an effective channel length (Leff) of 45 nm, a channel width of 1 μm, and an impurity concentration of $2 \times 10^{17}$ cm$^{-3}$ in a channel region. As a silicon base substrate, a P-type silicon base substrate having an impurity concentration of $1 \times 10^{15}$ cm$^{-3}$ was used.

A gate insulating film had a thickness of EOT=1 nm and p+polysilicon (having a work function of 5.1 eV) was used for the gate electrode. It has been found that, when a thickness of the SOI layer is reduced to about 17 nm or less, a threshold value of the NMOS transistor can be controlled even in case where the impurity concentration of the silicon base substrate is kept constant (for example, $1 \times 10^{15}$ cm$^{-3}$).

Further, it has also been found that even a short channel phenomenon can effectively be restrained when the thickness of the SOI layer is reduced to about ⅓ (15 nm) of the effective channel length Leff. Specifically, by controlling the thickness of the SOI layer, it was possible to change the threshold value of the accumulation-mode NMOS transistor to 0.4 to 0.5V.

However, it was not possible to lower a threshold voltage to a level applicable to the low-voltage power supply since the threshold value of the NMOS transistor having the above-mentioned structure depends only on the work function difference between the gate electrode and the SOI layer. Specifically, in the accumulation-mode NMOS transistor using the buried insulating layer (BOX) having a thickness of approximately 100 nm, it is not possible to change the threshold voltage determined by the work function difference, even if the impurity concentration of the silicon base substrate is changed. Further, when Ta (having a work function of 4.6 eV) was used for the gate electrode, it was not possible to achieve a normally-off transistor.

Figure 4:
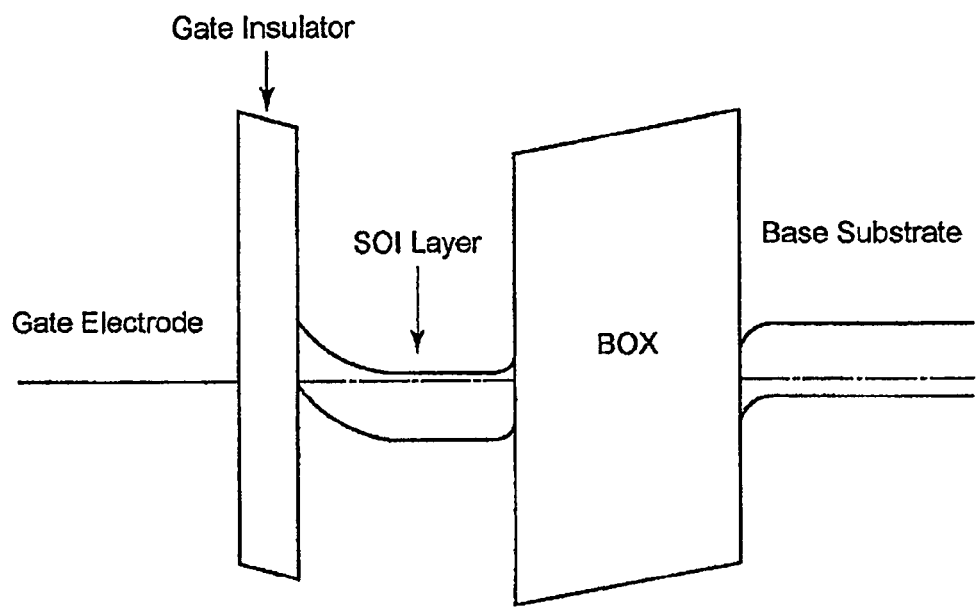
FIG. 4 is a view for describing a band structure in a transistor previously proposed.

Specifically, in case where the transistor is provided with the buried insulating layer (BOX) having a thickness of approximately 100 nm like the transistor previously proposed, the SOI layer has been controlled only on a gate electrode side because the buried insulating layer (BOX) is thick, as shown in FIG. 4.

Figure 5:
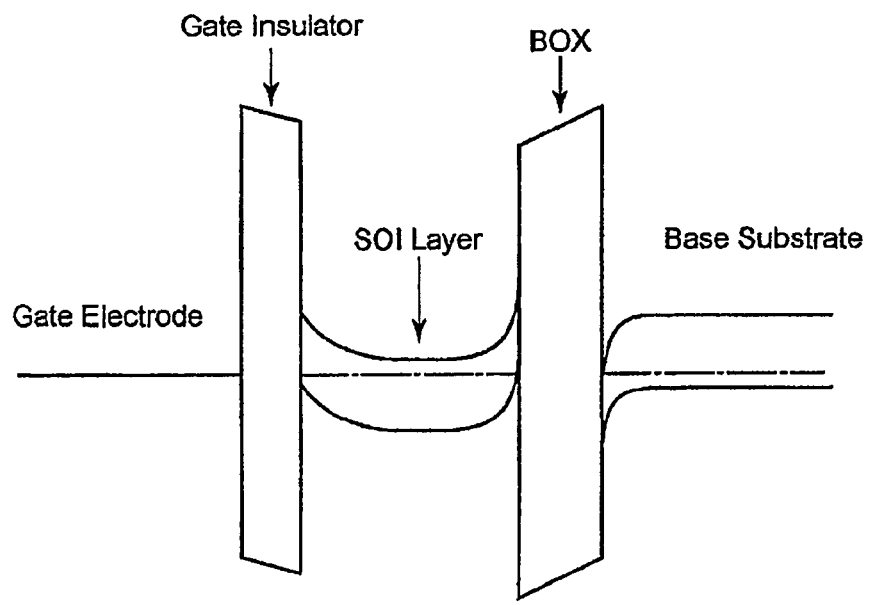
FIG. 5 is a view for describing a band structure in a transistor according to the present invention.

In contrast, the present inventors found out a phenomenon that an electric potential of the SOI layer can also be controlled from a base substrate side by reducing the thickness of the buried insulating layer (BOX), as shown in FIG. 5.

Specifically, the thickness ($T_{BOX}$) of the buried insulating layer (BOX) was reduced to less than 20 nm. The silicon base substrate as a supporting base substrate was subjected to ion implantation from its surface (a side on which the gate electrode is later constructed) to obtain an NMOS transistor in which an impurity concentration (NBase) of the silicon base substrate was changed. A drain voltage Vd of 1V was applied to the transistor and changes in drain current were observed. As a result, it was found that a threshold value of the NMOS transistor was changed depending on the impurity concentration (NBase) of the silicon base substrate.

As shown in FIG. 5, the SOI layer and the base substrate are inverse in conductivity type from each other. By reducing the thickness of the buried insulating layer (BOX), the SOI layer is depleted by a work function difference between the base substrate and the SOI layer. As a result, even by the use of a gate electrode, such as a Ta gate electrode, having a small difference in work function from the SOI layer, normally-off can be achieved and a high speed and a low power supply voltage can be achieved. According to this structure, the threshold value can effectively be controlled by adjusting the thickness of the buried insulating layer (BOX) and/or the impurity concentration of the SOI layer. The threshold value can finely be adjusted by controlling the concentration of the supporting base substrate. Incidentally, a conductive material having a large difference in work function from the SOI layer may also be used for a base substrate material.

Herein, in case where the base substrate is made of silicon having a predetermined impurity concentration (NBase) and impurities are introduced by ion implantation, an impurity concentration N(x) in a depth direction (x) of the base substrate is given by the following formula 1:

$$N(x) = \frac{Q}{\sqrt{2\pi}\Delta R_p^2} \exp\left\{-\frac{(x-R_p)^2}{2\Delta R_p^2}\right\}$$ [Formula 1]

Herein, Q, $R_p$, and $\Delta R_p^2$ denote an implantation dose, a projected range, and a standard deviation, respectively.

In the above formula, the maximum value of the concentration may be given by the following formula 2:

$$N_{mx} = \frac{Q}{\sqrt{2\pi}\Delta R_p^2}$$ [Formula 2]

N(x) must be controlled within a range of $0.2N_{max}$ to $0.5N_{max}$. Under an ion implantation condition in this device, $\Delta R_p$ can be approximated by $0.3R_p$. Therefore, a relationship of $0.36R_p < x < 0.46R_p$ is obtained. Accordingly, a formula of $0.56T_{SOI} < T_{BOX} < 0.85T_{SOI}$ is derived from $(0.36/0.64)T_{SOI} < T_{BOX} < (0.46/0.54)T_{SOI}$. Herein, TBOX and $T_{SOI}$ denote an EOT (Effective Oxide Thickness, namely, equivalent $SiO_2$ thickness) of the buried insulating layer and the thickness of the SOI layer, respectively.

Figure 6:
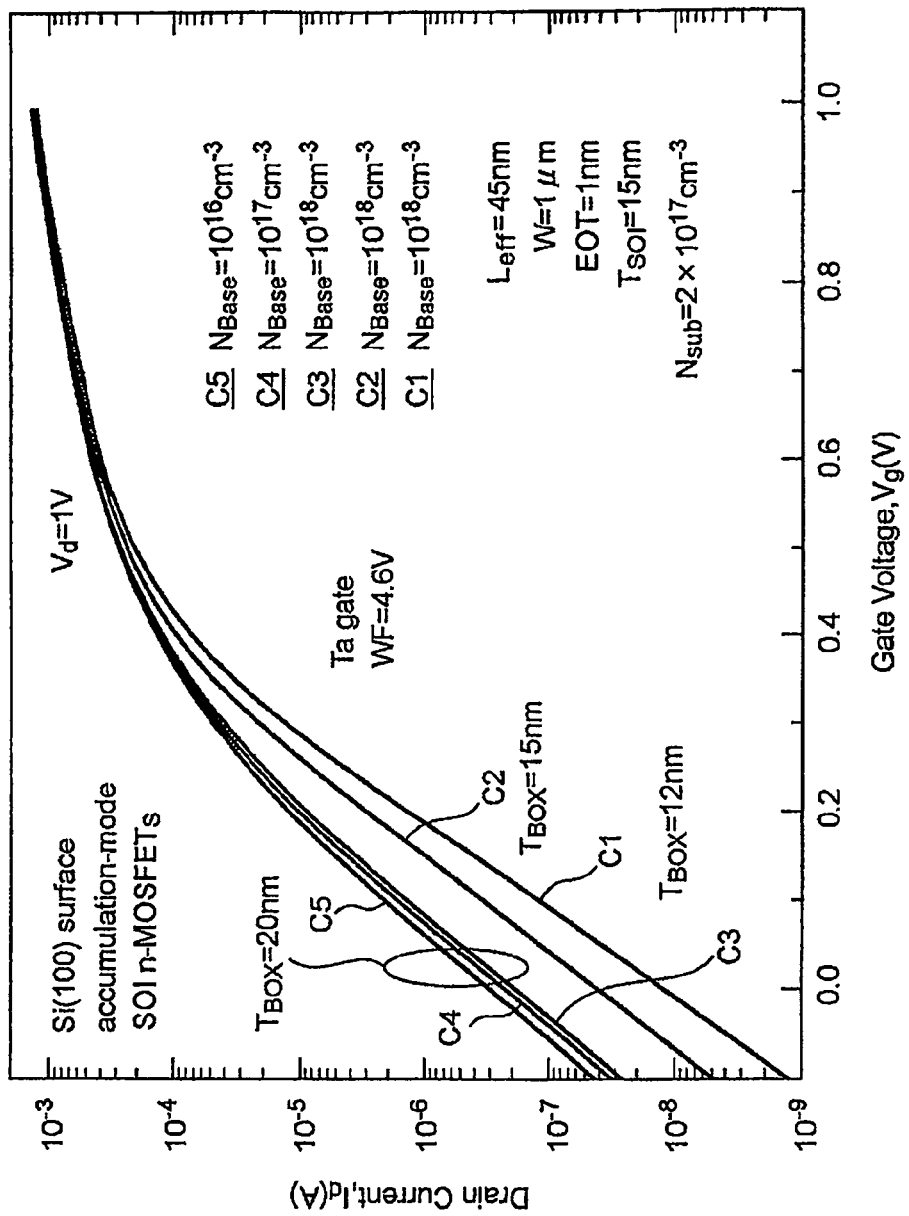
FIG. 6 is a graph showing changes in gate voltage (Vg)-drain current (Id) characteristic when a thickness (TBOX) of a buried insulating layer and an impurity concentration of a silicon base substrate are changed.

Referring to FIG. 6, a gate voltage (Vg)-drain current (Id) (A) characteristic of an accumulation-mode NMOS transistor, in which an SOI layer is formed on a (100) plane of a silicon base substrate, is shown. In this case, an effective channel length (Leff) and a channel width (W) of the transistor are 45 nm and 1 μm, respectively. An equivalent $SiO_2$ thickness (EOT) of a gate insulating film is 1 nm and a thickness (TSOI) of the SOI layer is 15 nm. An impurity concentration (Nsub) of a channel region in the SOI layer is $2 \times 10^{17}$ cm$^{-3}$. Further, as a gate electrode, tantalum (Ta) having a work function (WF) of 4.6 eV is used. FIG. 6 shows the characteristic in case where an electric voltage of 1V as a drain voltage Vd is applied to a drain electrode.

In FIG. 6, under the above-mentioned conditions, a thickness (TBOX) of a buried insulating layer and an impurity concentration (NBase) of a silicon supporting base substrate are changed. Specifically, a curve C1 shows a gate voltage-drain current characteristic when NBase is $1 \times 10^{18}$ cm$^{-3}$ and TBOX is 12 nm. On the other hand, a curve C2 shows a gate voltage-drain current characteristic when NBase is $1 \times 10^{18}$ cm$^{-3}$ and TBOX is 15 nm.

On the other hand, a curve C3 shows a gate voltage-drain current characteristic when NBase is $1 \times 10^{18}$ cm$^{-3}$ and TBOX is 20 nm. Likewise, curves C4 and C5 show gate voltage-drain current characteristics when TBOX is 20 nm and when NBase is $1 \times 10^{17}$ cm$^{-3}$ and $1 \times 10^{16}$ cm$^{-3}$, respectively.

As is clear from the curves C1 to C5, if the thickness (TBOX) of the buried insulating layer is within a range not greater than 20 nm, the gate voltage-drain current characteristic is changed also by the impurity concentration (NBase) of the silicon base substrate as the supporting base substrate. As a result, even with the Ta gate electrode, normally-off can be achieved. Further, depending on the thickness (TBOX) of the buried insulating layer, the gate voltage-drain current characteristic can be controlled and a threshold voltage (by the constant current method, the threshold voltage is defined as a gate voltage when an electric current of 1 μA flows) can be controlled to 0.05 to 0.2V. Further, it is understood from the curves C1 and C5 that the threshold voltage of the NMOS transistor can be changed depending on the impurity concentration (NBase) of the silicon base substrate when the thickness (TBOX) of the buried insulating layer is 20 nm or less. It is understood from the curves C1 to C3 that the threshold voltage can be changed by changing the thickness (TBOX) of the buried insulating layer. By adjusting the impurity concentration of the supporting base substrate, the threshold value can finely be adjusted.

On the other hand, when the buried insulating layer has a thickness (TBOX) of 20 nm, the threshold voltages can finely be adjusted by the impurity concentration (NBase) of the silicon base substrate, as is clear from the curves C3 to C5. However, if the thickness is greater, the threshold voltage no longer depends on the impurity concentration of the silicon base substrate.

As described in the foregoing, by adjusting the impurity concentration (NBase) of the silicon base substrate, the threshold voltage can finely be adjusted.

Figure 7:
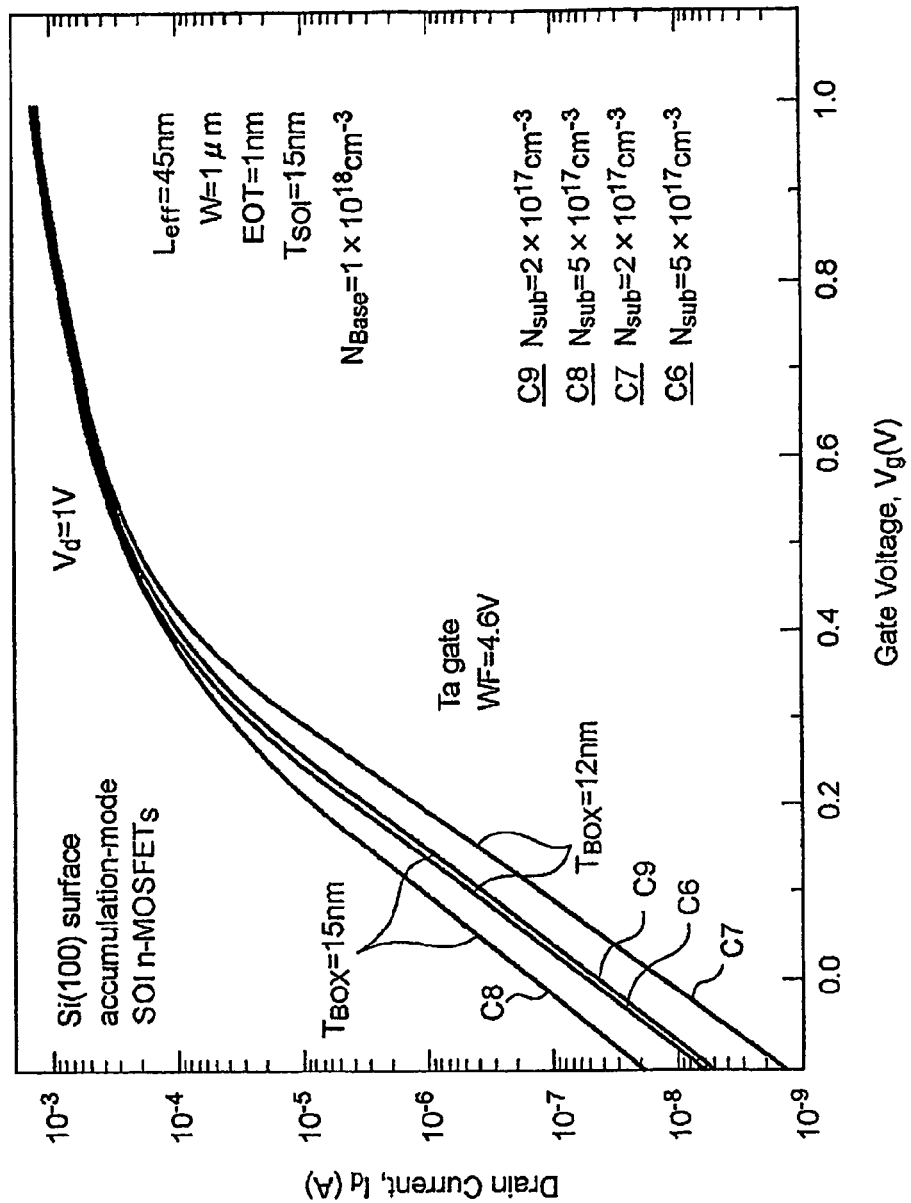
FIG. 7 is a graph showing changes in gate voltage (Vg)-drain current (Id) characteristic when an impurity concentration (Nsub) of an SOI layer and the thickness (TBOX) of the buried insulating layer are changed.

Further, referring to FIG. 7, a gate voltage-drain current characteristic is shown when the impurity concentration (Nsub) of the SOI layer and the thickness (TBOX) of the buried insulating layer are changed in a state where the impurity concentration (NBase) of the silicon base substrate is kept constant. Herein, like in FIG. 6, an accumulation-mode NMOS transistor as an object has an effective channel length (Leff) of 45 nm and a channel width (W) of 1 μm. In addition, an equivalent $SiO_2$ thickness (EOT) of a gate insulating film is 1 nm and a thickness (TSOI) of the SOI layer is 15 nm. Further, an impurity concentration (NBase) of the silicon base substrate is $1 \times 10^{18}$ cm$^{-3}$ and, as a gate electrode, tantalum (Ta) having a work function (WF) of 4.6 eV was used. Also in FIG. 7, an electric voltage of 1V as a drain voltage Vd was applied to a drain electrode.

Each of curves C6 and C7 shown in FIG. 7 is the characteristic when the buried insulating layer has a thickness (TBOX) of 12 nm. On the other hand, each of curves C8 and C9 is the characteristic when the buried insulating layer has a thickness (TBOX) of 15 nm. Further, each of the curves C6 and C8 is the characteristic when the SOI layer has an impurity concentration (Nsub) of $5 \times 10^{17}$ cm$^{-3}$. Each of the curves C7 and C9 is the characteristic when the SOI layer has an impurity concentration (Nsub) of $2 \times 10^{17}$ cm$^{-3}$.

As is clear from comparison between the curves C6 and C7 and the curves C8 and C9, when the thickness (TBOX) of the buried insulating layer is kept constant, a higher drain current Id flows at a low gate voltage Vg as the impurity concentration (Nsub) of the SOI layer is higher. On the other hand, when the impurity concentration (Nsub) of the SOI layer is kept constant, a higher electric current flows as the thickness (TBOX) of the buried insulating layer is greater.

From this fact, it is understood that, by adjusting the impurity concentration (Nsub) of the SOI layer or by adjusting the thickness (TBOX) of the buried insulating layer, the threshold voltage can be controlled.

Figure 8:
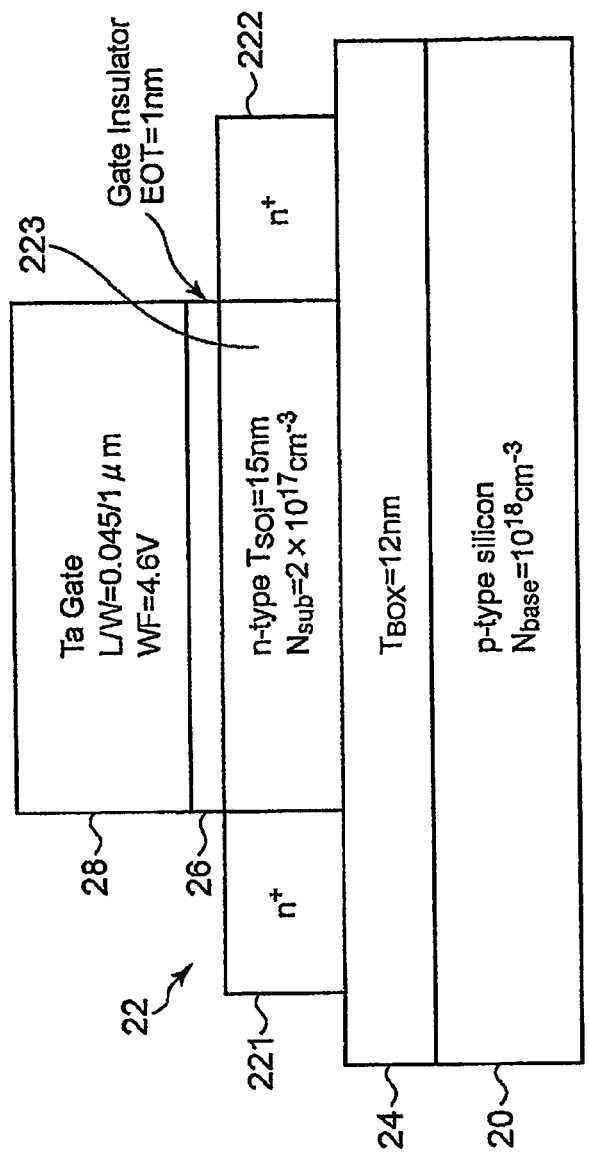
FIG. 8 is a sectional view showing a structure of an accumulation-mode NMOS transistor according to an embodiment of the present invention.

Referring to FIG. 8, a specific example of the semiconductor device according to the present invention will be described. The semiconductor device shown in the figure is an accumulation-mode NMOS transistor using an SOI layer 22 formed on a P-type silicon base substrate 20 with a buried insulating layer 24 intermediate therebetween. On a surface of the P-type silicon base substrate 20, the buried insulating layer 24 having a thickness (TBOX) of 12 nm and made of $SiO_2$ is formed. The P-type silicon base substrate 20 is doped with impurities by ion implantation through the buried insulating layer 24 and its surface impurity concentration (Nbase) is adjusted to $10^{18}$ cm$^{-3}$. That is, the semiconductor device shown in the figure can be manufactured by adding a process of implanting ions through the buried insulating layer 24.

On the other hand, the SOI layer 22 is an N-type layer which has a thickness (TSOI) of 15 nm and a conductivity type inverse to that of the silicon base substrate 20. The SOI layer 22 has a source region 221, a drain region 222, and a channel region 223. Among them, the channel region 223 has an impurity concentration (Nsub) of $2\times10^{17}$ cm$^{-3}$ and each of the source region 221 and the drain region 222 has an impurity concentration higher than that of the channel region 223. Further, the channel region 223 has an effective length (Leff) of 45 nm and a width (W) of 1 µm.

Further, on the channel region 223, a gate insulating film 26 having an equivalent SiO$_2$ thickness (EOT) of 1 nm is formed. On the gate insulating film 26, a gate electrode 28 formed by a Ta material having a work function (WF) of 4.6 eV is provided. The gate electrode 28 has a length (L) of 0.045 nm and a width (W) of 1 µm. Incidentally, the buried insulating layer 24 may also be formed by a different material, such as Si$_3$N$_4$, having an EOT of 12 nm.

Since the accumulation-mode NMOS transistor shown in FIG. 8 exhibits a gate voltage-drain current characteristic as shown by the curve C1 in FIG. 6, the gate electrode 28 can be formed by using Ta having a low work function (WF). As a result, it is possible to obtain a transistor having a low threshold voltage. Therefore, the NMOS transistor shown in the figure is applicable also to a circuit having a low voltage source.

In the foregoing embodiment, only the accumulation-mode NMOS transistor has been described. However, the present invention is similarly applicable also to an accumulation-mode PMOS transistor.

Further, in case where the present invention is applied to the n- and p-channel inversion-mode MOS transistors shown in FIGS. 1 (c) and (d), the depletion layer in the channel region of the SOI layer can be controlled from an under side to thereby adjust the threshold value by controlling the thickness of the BOX layer, the impurity concentration of the base substrate, and the impurity concentration of the SOI layer. In other words, a base substrate bias effect depending on the impurity concentration of the base substrate can be used.

INDUSTRIAL APPLICABILITY

The present invention has been described only in connection with the single accumulation-mode MOS transistor. However, a CMOS may be constructed by combining accumulation-mode MOS transistors different in conductivity type from each other. The present invention is also applicable to an inversion-mode MOS transistor and, in a combination of the accumulation-mode MOS transistor and the inversion-mode MOS transistor, to each or both of these transistors.

The invention claimed is:

1. A semiconductor device comprising:
a supporting base substrate,
a buried insulating layer formed on the supporting base substrate,
a semiconductor region formed on the buried insulating layer, at least a part of the semiconductor region serving as a channel region,
a gate insulating film formed on the channel region, and
a gate electrode formed on the gate insulating film,
wherein a threshold value is specified by adjusting a thickness of the buried insulating layer and an impurity concentration of the semiconductor region, and
the threshold value is further adjusted by an impurity concentration of the supporting base substrate when the buried insulating layer has a thickness not greater than 20 nm,
wherein the supporting base substrate and the semiconductor region are made of silicons having opposite conductivity types to each other,
wherein the semiconductor device is of a normally-off type,
wherein the supporting base substrate has a single conductivity type.

2. The semiconductor device as claimed in claim 1, wherein a thickness of a depletion layer in the channel region depends on the thickness of the buried insulating layer and the impurity concentration of the supporting base substrate.

3. The semiconductor device as claimed in claim 1 or 2, wherein the semiconductor device has a source region and a drain region electrically connected to the channel region, the gate electrode being constructed by at least partially using a material having a work function different from that of the channel region, the thickness of the depletion layer in the channel region being determined by adjusting a work function difference between the gate electrode and the channel region, the impurity concentration of the supporting base substrate, and the thickness of the buried insulating layer.

4. The semiconductor device as claimed in claim 3, wherein the threshold value is smaller than that determined by the work function difference between the gate electrode and the channel region.

5. The semiconductor device as claimed in claim 1, wherein the semiconductor device is of an accumulation mode with the channel region, the source region, and the drain region having the same conductivity type.

6. The semiconductor device as claimed in claim 1 or 2, wherein the semiconductor region has an impurity concentration not less than $10^{17}$ cm$^{-3}$.

7. The semiconductor device as claimed in claim 1 or 2, wherein the thickness of the buried insulating layer satisfies the following formula, $$0.56T_{SOI} < T_{BOX} < 0.85T_{SOI}$$

wherein $T_{BOX}$ and $T_{SOI}$ denote EOT of the buried insulating layer and a thickness of the semiconductor region, respectively.

8. The semiconductor device as claimed in claim 7, wherein an end portion of the channel region on the side of the source region is depleted throughout an entire thickness in the thickness direction when a power supply voltage is applied to the drain region and a gate electrode is kept at 0 volt.

9. The semiconductor device as claimed in claim 1, wherein the gate electrode is a Ta gate electrode.

10. The semiconductor device as claimed in claim 2, wherein the gate electrode is a Ta gate electrode.

* * * * *

UNITED STATES PATENT AND TRADEMARK OFFICE
CERTIFICATE OF CORRECTION

PATENT NO. : 8,643,106 B2  Page 1 of 1
APPLICATION NO. : 12/308846
DATED : February 4, 2014
INVENTOR(S) : Ohmi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 580 days.

Signed and Sealed this

Twenty-ninth Day of September, 2015

Michelle K. Lee
*Director of the United States Patent and Trademark Office*